(12) United States Patent
Prasad et al.

(10) Patent No.: US 11,200,934 B2
(45) Date of Patent: Dec. 14, 2021

(54) TUNNELING METAMAGNETIC RESISTANCE MEMORY DEVICE AND METHODS OF OPERATING THE SAME

(71) Applicant: WESTERN DIGITAL TECHNOLOGIES, INC., San Jose, CA (US)

(72) Inventors: Bhagwati Prasad, San Jose, CA (US); Alan Kalitsov, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/853,407

(22) Filed: Apr. 20, 2020

(65) Prior Publication Data

US 2021/0327483 A1   Oct. 21, 2021

(51) Int. Cl.
| | |
|---|---|
| *G11C 11/16* | (2006.01) |
| *H01L 43/10* | (2006.01) |
| *H01L 43/08* | (2006.01) |
| *H01L 43/02* | (2006.01) |
| *H01L 27/22* | (2006.01) |

(52) U.S. Cl.
CPC ........ *G11C 11/161* (2013.01); *G11C 11/1655* (2013.01); *G11C 11/1657* (2013.01); *H01L 27/222* (2013.01); *H01L 43/02* (2013.01); *H01L 43/08* (2013.01); *H01L 43/10* (2013.01)

(58) Field of Classification Search
CPC .............. G11C 11/161; G11C 11/1655; G11C 11/1657; H01L 43/02; H01L 43/10; H01L 43/08; H01L 27/222

USPC .................................................. 365/158, 159
See application file for complete search history.

(56) References Cited

U.S. PATENT DOCUMENTS

| | | | | |
|---|---|---|---|---|
| 7,035,062 | B1 * | 4/2006 | Mao ........................ | B82Y 10/00 360/324.2 |
| 8,045,299 | B2 * | 10/2011 | Fontana, Jr. ......... | G11B 5/3903 360/324.2 |
| 8,987,847 | B2 | 3/2015 | Jan et al. | |
| 9,007,720 | B2 * | 4/2015 | Fukuzawa ................ | G11B 5/66 360/125.3 |

(Continued)

FOREIGN PATENT DOCUMENTS

CN            105679339 A     6/2016

OTHER PUBLICATIONS

Cherifi, R.O. et al., "Electric-field control of magnetic order above room temperature" Nature Materials, Nature Publishing Group, 2014, pp. nmat3870. 10.1038/NMAT3870. hal-01053074, https://hal.archives-ouvertes.fr/hal-01053074.

(Continued)

*Primary Examiner* — Michael T Tran
(74) *Attorney, Agent, or Firm* — The Marbury Law Group PLLC

(57) ABSTRACT

A magnetoresistive memory device includes a first electrode, a second electrode, and a layer stack located between the first electrode and the second electrode. The layer stack may include a ferroelectric material layer and a metamagnetic tunnel junction containing a metamagnetic material layer, an insulating barrier layer, and a metallic material layer. Alternatively, the layer stack may include a multiferroic material layer, the metamagnetic material layer, the insulating barrier layer, and a reference magnetization layer.

19 Claims, 4 Drawing Sheets

(56) References Cited

U.S. PATENT DOCUMENTS

| | | | |
|---|---|---|---|
| 9,230,626 | B2* | 1/2016 | Buhrman ............... H01L 43/08 |
| 9,941,469 | B2* | 4/2018 | Worledge ............... H01L 43/10 |
| 10,304,508 | B2* | 5/2019 | Sugahara ............. G11C 11/161 |
| 10,354,710 | B2 | 7/2019 | Petti et al. |
| 10,541,014 | B2* | 1/2020 | Doyle ................. G11C 11/161 |
| 10,763,428 | B2* | 9/2020 | Liu ........................ H01L 43/10 |
| 10,788,547 | B2* | 9/2020 | Kalitsov ............. G11C 11/161 |
| 2005/0168317 | A1* | 8/2005 | Clifton .................. B82Y 25/00 338/32 R |
| 2006/0198059 | A1* | 9/2006 | Sakai .................. G11B 5/3932 360/324.12 |
| 2008/0043376 | A1* | 2/2008 | Ohtsu ................. G11B 5/3967 360/314 |
| 2012/0308728 | A1* | 12/2012 | Fukuzawa ............. H01L 43/08 427/343 |
| 2013/0002362 | A1* | 1/2013 | Cyrille ................. H03B 15/006 331/154 |
| 2013/0094108 | A1* | 4/2013 | Gao .................... G01R 33/093 360/234.3 |
| 2013/0106410 | A1* | 5/2013 | Liu .................... G01R 33/0041 324/246 |
| 2014/0198564 | A1* | 7/2014 | Guo ................... G11C 11/1673 365/158 |
| 2014/0327096 | A1* | 11/2014 | Guo ....................... H01L 43/10 257/421 |
| 2017/0170389 | A1* | 6/2017 | Hase ..................... G11C 11/161 |
| 2018/0351090 | A1 | 12/2018 | Suzuki et al. |
| 2018/0356474 | A1* | 12/2018 | Hammerschmidt . G01R 33/093 |
| 2019/0027201 | A1 | 1/2019 | Petti et al. |
| 2019/0123266 | A1 | 4/2019 | Pietambaram et al. |
| 2019/0333559 | A1 | 10/2019 | Van't Erve et al. |
| 2019/0386205 | A1* | 12/2019 | Gosavi .................... H01L 43/04 |
| 2019/0386208 | A1 | 12/2019 | Lin et al. |
| 2019/0393411 | A1* | 12/2019 | Ando ..................... H01F 41/22 |
| 2020/0091407 | A1 | 3/2020 | Liu et al. |
| 2020/0091414 | A1 | 3/2020 | Liu et al. |
| 2020/0217907 | A1* | 7/2020 | Raberg ............... H01F 10/3286 |
| 2020/0312906 | A1* | 10/2020 | Reznicek ............ H01L 45/1608 |
| 2020/0388648 | A1* | 12/2020 | Kuo .................. H01L 21/76802 |
| 2020/0395531 | A1* | 12/2020 | Kwon .................... H01L 43/08 |
| 2020/0411094 | A1* | 12/2020 | Jaiswal ............... G11C 11/4094 |
| 2021/0090679 | A1* | 3/2021 | Tran ...................... H01L 27/222 |
| 2021/0118950 | A1* | 4/2021 | Hatcher ............. G11C 11/1675 |
| 2021/0135091 | A1 | 5/2021 | Park et al. |
| 2021/0143215 | A1 | 5/2021 | Zhang |
| 2021/0151505 | A1* | 5/2021 | Han .................... H01L 27/2463 |
| 2021/0159393 | A1 | 5/2021 | Law et al. |
| 2021/0159401 | A1 | 5/2021 | Guo |

OTHER PUBLICATIONS

Chiba, D. et al., "Electrical Manipulation of Magnetization Reversal in a Ferromagnetic Semiconductor," Science, vol. 301, pp. 943-945, Aug. 15, 2003, www.sciencemag.org.

Chiba, D. et al., "Electrical control of the ferromagnetic phase transition in cobalt at room temperature," Nature Materials, vol. 10, pp. 853-856, Nov. 2011, www.nature.com/naturematerials.

Heron, J.T. et al., "Electric field control of magnetism using BiFeO3-based heterostructures," Applied Physics Reviews, vol. 1, No. 021303, (2014), doi: 10.1063/1.4870957.

Wang, L. et al., "Charge-induced ferromagnetic phase transition and anomalous Hall effect in full d-band nonmagnetic metals," Physical Review B 99, 224416 (2019).

Yamada, Y. et al., "Electrically Induced Ferromagnetism at Room Temperature in Cobalt-Doped Titanium Dioxide," Science, vol. 332, pp. 1065-1067, May 27, 2011, www.sciencemag.org.

Spaldin, N. A. et al., "Advances in magnetoelectric multiferroics," Nature Materials, vol. 18, Mar. 2019, pp. 203-212, www.nature.com/naturematerials 203.

U.S. Appl. No. 16/212,132, filed Dec. 6, 2018, SanDisk Technologies LLC.

U.S. Appl. No. 16/212,257, filed Dec. 6, 2018, SanDisk Technologies LLC.

U.S. Appl. No. 16/212,342, filed Dec. 6, 2018, SanDisk Technologies LLC.

U.S. Appl. No. 16/212,420, filed Dec. 6, 2018, SanDisk Technologies LLC.

U.S. Appl. No. 16/227,889, filed Dec. 20, 2018, SanDisk Technologies LLC.

U.S. Appl. No. 16/250,403, filed Jan. 17, 2019, SanDisk Technologies LLC.

U.S. Appl. No. 16/401,172, filed May 2, 2019, Western Digital Technologies, Inc.

U.S. Appl. No. 16/686,860, filed Nov. 18, 2019, SanDisk Technologies LLC.

U.S. Appl. No. 16/686,917, filed Nov. 18, 2019, SanDisk Technologies LLC.

U.S. Appl. No. 16/692,903, filed Nov. 22, 2019, Western Digital Technologies, Inc.

U.S. Appl. No. 16/692,965, filed Nov. 22, 2019, Western Digital Technologies, Inc.

U.S. Appl. No. 16/693,006, filed Nov. 22, 2019, Western Digital Technologies, Inc.

U.S. Appl. No. 16/778,245, filed Jan. 31, 2020, SanDisk Technologies LLC.

U.S. Appl. No. 16/781,225, filed Feb. 4, 2020, Western Digital Technologies, Inc.

U.S. Appl. No. 16/798,643, filed Feb. 24, 2020, SanDisk Technologies LLC.

U.S. Appl. No. 16/798,686, filed Feb. 24, 2020, SanDisk Technologies LLC.

U.S. Appl. No. 16/824,814, filed Mar. 20, 2020, Western Digital Technologies, Inc.

Prasad, B. et al., "Tunneling Metamagnetic Resistance Memory Device and Methods of Operating the Same," U.S. Appl. No. 16/853,440, filed Apr. 20, 2020.

Ohtake, M. et al., "L10 ordered phase formation in FePt, FePd, CoPt, and CoPd alloy thin films epitaxially grown on MgO(001) single-crystal substrates," Journal of Applied Physics, vol. 111, 07A708 (2012); http://dx.doi.org/10.1063/1.3672856.

Yoon, M. et al., "Relaxor normal ferroelectric transition in tetragonal rich field of Pb(Ni1/3Nb2/3)O3PbTiO3PbZrO3 system," Journal of Applied Physics, vol. 77, No. 8, pp. 3991-4001, (1995); http://dx.doi.org/10.1063/1.359510.

Notification of Transmittal of the International Search Report and the Written Opinion of the International Searching Authority for International Patent Application No. PCTUS2020/067692, dated Mar. 18, 2021, 11 pages.

USPTO Office Communication, Non-Final Office Action, for U.S. Appl. No. 16/853,440, dated Feb. 9, 2021, 16 pages.

USPTO Office Communication, Notice of Allowance and Fee(s) Due for U.S. Appl. No. 16/853,440, dated Jun. 21, 2021, 14 pages.

\* cited by examiner

TUNNELING METAMAGNETIC RESISTANCE MEMORY DEVICE AND METHODS OF OPERATING THE SAME

FIELD

The present disclosure relates generally to the field of magnetoresistive memory devices and specifically to tunneling metamagnetic resistance memory devices employing electrical field-induced switching and methods of operating the same.

BACKGROUND

A magnetoresistive memory device can store information employing the difference in electrical resistance of a first configuration in which a free magnetization layer has a magnetization direction that is parallel to the magnetization of a reference magnetization layer and a second configuration in which the free magnetization layer has a magnetization direction that is antiparallel to the magnetization of the reference magnetization layer. Programming of the magnetoresistive memory device, such as a STT-MRAM, typically involves flipping of the direction of the magnetization of the free layer employing an external power source using a tunneling current through a magnetic tunnel junction. However, the switching power required to generate the tunneling current is higher than desired.

SUMMARY

According to an aspect of the present disclosure, a magnetoresistive memory device includes a first electrode, a second electrode and a layer stack located between the first electrode and the second electrode, the layer stack comprising a ferroelectric material layer and a metamagnetic tunnel junction. The metamagnetic tunnel junction comprises a metamagnetic material layer, a metallic material layer, and an insulating barrier layer between the metallic material layer and the metamagnetic material layer.

According to another aspect of the present disclosure, a magnetoresistive memory device includes a first electrode, a second electrode, and a layer stack located between the first electrode and the second electrode, the layer stack comprising a multiferroic material layer and a metamagnetic tunnel junction. The metamagnetic tunnel junction comprises a metamagnetic material layer, a reference magnetization layer, and an insulating barrier layer between the reference magnetization layer and the metamagnetic material layer.

According to still another aspect of the present disclosure, a method of operating any magnetoresistive memory device of the present disclosure is provided, which comprises: applying a first polarity programming voltage to the first electrode relative to the second electrode in a first programming step to switch a state of the metamagnetic material layer from the non-magnetic state to the magnetic state; and applying a second polarity programming voltage having an opposite polarity of the first polarity programming voltage the first electrode relative to the second electrode in a second programming step to switch the state of the metamagnetic material layer from the magnetic state to the non-magnetic state.

DETAILED DESCRIPTION

Figure 1:
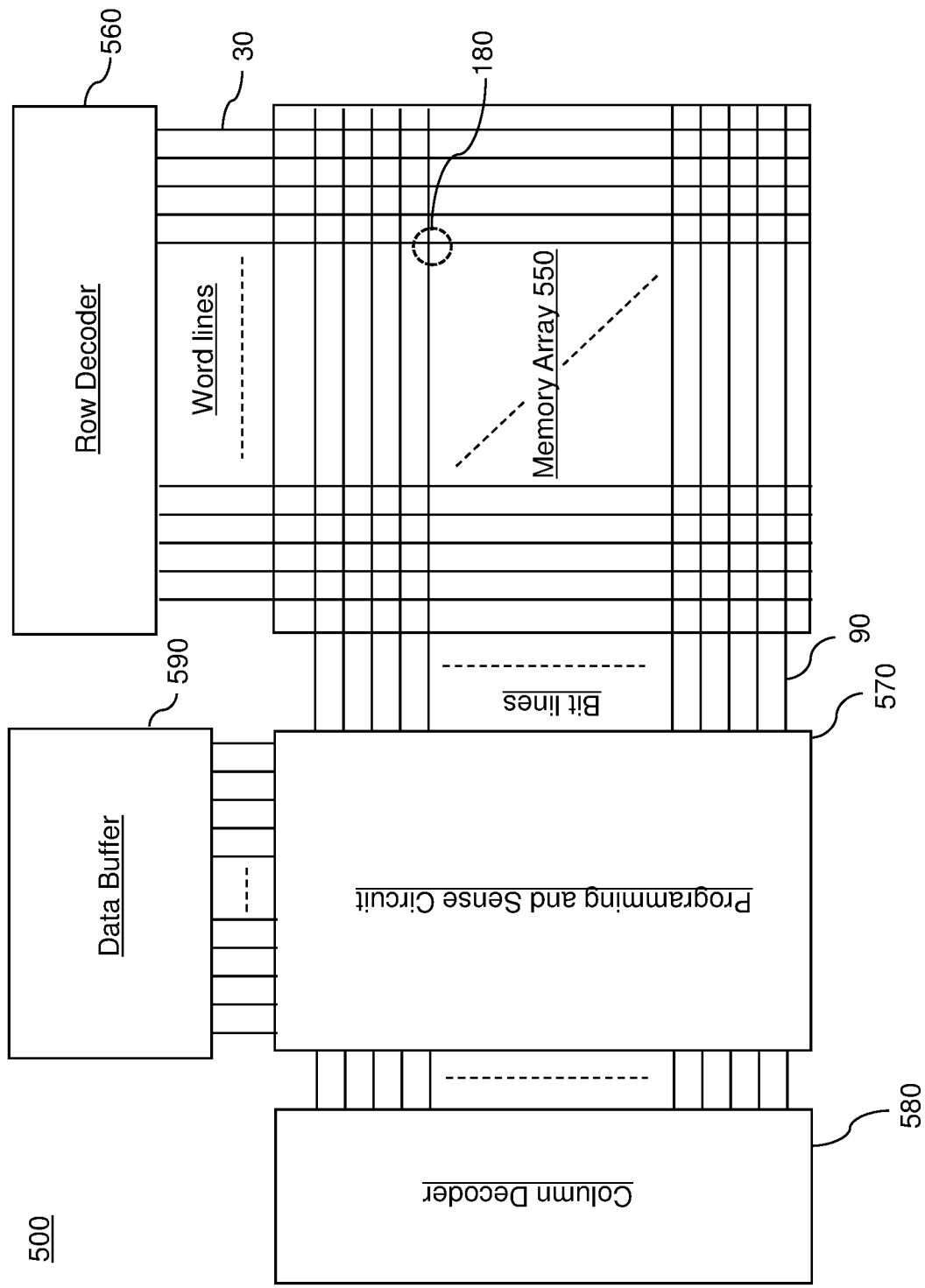
FIG. 1 is a schematic diagram of a random access memory device including magnetoresistive memory cells of the present disclosure in an array configuration.

As discussed above, the embodiments of the present disclosure are directed to tunneling metamagnetic resistance memory devices employing electrical field-induced switching and methods of operating the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

Referring to FIG. 1, a schematic diagram is shown for a magnetoresistive random access memory (MRAM) device 500 including multiple magnetoresistive memory cells 180 of embodiments of the present disclosure. In one embodiment, the magnetoresistive random access memory device 500 can contain a two-dimensional array or a three-dimensional array of magnetoresistive memory cell 180 of the embodiments of the present disclosure. As used herein, a "random access memory device" refers to a memory device containing memory cells that allow random access, e.g., access to any selected memory cell upon a command for reading the contents of the selected memory cell.

The magnetoresistive random access memory device 500 can include a memory array region 550 containing an array of the respective magnetoresistive memory cells 180 located at the intersection of the respective word lines 30 and bit lines 90. The magnetoresistive random access memory device 500 may also contain a row decoder 560 connected to the word lines 30, a combination of a programming and sensing circuit 570 (which can include programming transistors, sense amplifiers, and other bit line control circuitry) connected to the bit lines 90, a column decoder 580 connected to the bit lines 90 through the programming and sensing circuit 570, and a data buffer 590 connected to the programming and sensing circuit 570. Multiple instances of the magnetoresistive memory cells 180 are provided in an array configuration that forms the magnetoresistive random access memory device 500. As such, each of the magnetoresistive memory cells 180 can be a two-terminal device including a respective first electrode and a respective second electrode. It should be noted that the location and interconnection of elements are schematic and the elements may be arranged in a different configuration. Further, a magnetoresistive memory cell 180 may be manufactured as a discrete device, i.e., a single isolated device.

Figure 2:
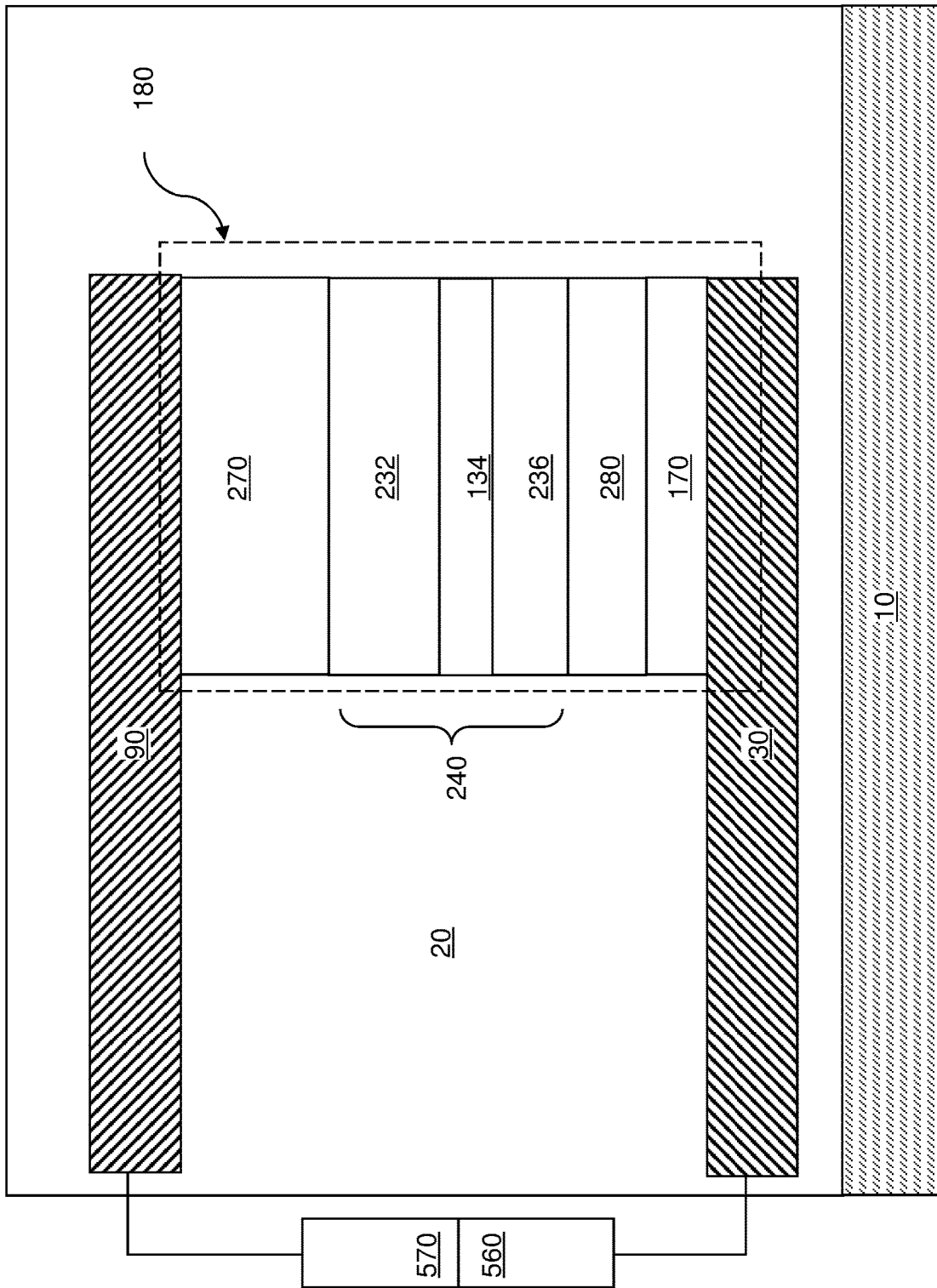
FIG. 2 schematically illustrates a first exemplary tunneling metamagnetic resistance (TMMR) memory cell according to a first embodiment of the present disclosure.

Referring to FIG. 2, a first exemplary magnetoresistive memory device according to a first embodiment of the present disclosure is illustrated. The first exemplary magnetoresistive memory cell 180 is a tunneling metamagnetic resistance (TMMR) memory cell. The first exemplary magnetoresistive memory device includes a magnetoresistive memory cell 180 that can function as a unit memory cell of the TMMR magnetoresistive random access memory (TMMR MRAM) device 500 shown in FIG. 1. In this case, a plurality of magnetoresistive memory cells 180 can be formed in an array configuration, which may be a two-dimensional array configuration or a three-dimensional array configuration. Alternatively, the magnetoresistive memory cell 180 illustrated in FIG. 2 may be formed as a discrete memory device that is connected to a respective programming and sensing circuit. In other words, each magnetoresistive memory cell 180 may be connected to a respective programming and sensing circuit.

Each magnetoresistive memory cell 180 can include a first electrode 170, a second electrode 270, and a layer stack (280, 240) located between the first electrode 170 and the second electrode 270. The layer stack (280, 240) includes a ferroelectric material layer 280 having a non-zero ferroelectric polarization (i.e., electric polarization), and includes a metamagnetic tunnel junction 240. The metamagnetic tunnel junction 240 is shown in FIG. 2 as being located on the ferroelectric material layer 280 (i.e., between the ferroelectric material layer 280 and the second electrode 270). However, in an alternative embodiment, the metamagnetic tunnel junction 240 may be located under the ferroelectric material layer 280 (i.e., between the ferroelectric material layer 280 and the first electrode 170). The metamagnetic tunnel junction 240 can contact a surface of the ferroelectric material layer 280.

In one embodiment, each first electrode 170 can be located on a respective one of the word lines 30, and each second electrode 270 can be located on a respective one of the bit lines 90. Alternatively, each first electrode 170 can be located on a respective one of the bit lines 90, and each second electrode 270 can be located on a respective one of the word lines 30. Alternatively, each electrode (170, 270) can be a portion of a respective word line 30 or bit line 90 rather than a separate layer which contacts the respective word line or bit line. The word lines 30 can be formed as a one-dimensional array of first metal lines located at a first metal interconnect level and laterally extending along a first horizontal direction, and the bit lines 90 can be formed as a one-dimensional array of second metal lines located at a second metal interconnect level and laterally extending along a second horizontal direction which may be non-parallel to (e.g., perpendicular to) the first horizontal direction. In one embodiment, each of the word lines 30 and the bit lines 90 can comprise a metallic nitride liner including an optional conductive metallic nitride material (such as TiN, TaN, or WN) and a metallic fill material (such as Cu, W, Co, Ru, Mo, Al, etc.).

The first electrode 170 can comprise, and/or can consist essentially of, a conductive metallic nitride material or a non-magnetic metallic material including at least one transition metal. The at least one transition metal of the non-magnetic metallic material may be selected from Cu, Cr, Ti, Ta, W, Mo, Al, Au and/or Ru. In this case, the sidewalls of the first electrode 170 may, or may not, be vertically coincident with sidewalls of the metamagnetic tunnel junction 240. In one embodiment, the thickness of the first electrode 170 may be in a range from 1 nm to 20 nm, such as from 2 nm to 10 nm, although lesser and greater thicknesses can also be employed.

Each layer stack (280, 240) can be formed, for example, by depositing a set of continuous material layers, and by patterning the set of continuous material layer by a combination of lithographic patterning methods and an anisotropic etch process or by a focused ion beam etching process. Each layer stack (280, 240) can optionally include a set of sidewalls that are vertically coincident with each other. As used herein, two surfaces are "vertically coincident" if one of the two surfaces overlie or underlie the other of the two surfaces and if there exists a vertical plane that contains the two surfaces. The word lines 30, a two-dimensional array of magnetoresistive memory cells 180, and the bit lines 90 may be embedded within interconnect-level dielectric material layers 20 that are formed over a substrate 10, which may be a semiconductor substrate, such as a silicon substrate, or an insulating substrate, such as a sapphire substrate.

The ferroelectric material layer 280 can include, and/or can consist essentially of, at least one ferroelectric dielectric material such as hafnium oxide (such as hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (such as $BaTiO_3$; BT), colemanite (such as $Ca_2B_6O_{11} \cdot 5H_2O$), bismuth titanate (such as $Bi_4Ti_3O_{12}$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), lanthanum aluminum oxide ($LaAlO_3$), polyvinylidene fluoride ($(CH_2CF_2)_n$), potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)).

The metamagnetic tunnel junction 240 can include a metamagnetic material layer 236 located in contact with (e.g., located on in FIG. 2) the ferroelectric material layer 280. As used herein, a "metamagnetic material" refers to a material having a non-magnetic state and a magnetic state. As used herein, a "metamagnetic tunnel junction" refers to a tunnel junction including a metamagnetic material layer, i.e., a layer consisting essentially of a metamagnetic material. The magnetic state of the metamagnetic material may be a ferromagnetic state having a non-zero net magnetization, a ferrimagnetic state, or an antiferromagnetic state. The non-magnetic state may be a paramagnetic state or a diamagnetic state. In one embodiment, the metamagnetic material layer 236 can comprise, and/or can consist essentially of, a material selected from Co, a FeRh alloy, an EuSe alloy, $CrO_2$, and/or lanthanum strontium manganite ("LSM", e.g., $La_{1-x}Sr_xMnO_3$).

The insulating barrier layer 134 includes an insulating tunnel barrier material for forming a metamagnetic tunnel junction. The insulating barrier layer 134 can include, for example, magnesium oxide, aluminum oxide, strontium titanate, or a combination thereof. The thickness of the insulating barrier layer 134 can be sufficiently thin to permit tunneling current to flow through it, such as a thickness in a range from 0.5 nm to 2 nm, such as from 0.7 nm to 1.2 nm, although lesser and greater thicknesses can also be employed.

The metallic material layer 232 can include any metallic material that does not affect the transition between the magnetic state and the non-magnetic state within the metamagnetic material layer 236. In one embodiment, the metallic material layer 232 includes a non-ferromagnetic metallic material, i.e., a metallic material that does not have a ferromagnetic state. In one embodiment, the metallic material layer 232 includes a non-magnetic metallic material, i.e., a metallic material that does not have a ferromagnetic state, a ferrimagnetic state, or an antiferromagnetic state. For example, the metallic material layer 232 can include Cu, Cr, Ti, Ta, Au and/or Ru. The thickness of the metallic material layer 232 may be in a range from 1 nm to 10 nm, such as from 2 nm to 5 nm, although lesser and greater thicknesses can also be employed.

In one embodiment, the second electrode 270 may comprise a non-magnetic capping layer located on the metallic material layer 232. For example, if the metallic material layer 232 comprises Cr, then the capping layer can comprise, and/or can consist essentially of, Ru and/or Ta. Alternatively, the second electrode 270 may comprise at least one non-magnetic transition metal, which may be selected from Cu, Cr, Ti, Ta, W, Mo, Al, Au and/or Ru.

The sidewalls of the second electrode 270 may, or may not, be vertically coincident with sidewalls of the metamagnetic tunnel junction 240. The thickness of the second electrode 270 may be in a range from 1 nm to 20 nm, such as from 2 nm to 10 nm, although lesser and greater thicknesses can also be employed.

In an alternative embodiment, the first electrode 170 may comprise a portion of a word line 30 that has an areal overlap with the area of the metamagnetic tunnel junction 240 and may directly contact a surface of the ferroelectric material layer 280. Additionally or alternatively, the second electrode 270 may comprise a portion of a bit line 90 that has an areal overlap with the area of the metamagnetic tunnel junction 240 and may directly contact a surface of the metallic material layer 232.

A magnetoresistive memory device 180 of the first embodiment includes a first electrode 170, a second electrode 270 and a layer stack (240, 280) located between the first electrode and the second electrode, the layer stack comprising a ferroelectric material layer 280 and a metamagnetic tunnel junction 240. The metamagnetic tunnel junction 240 comprises a metamagnetic material layer 236, a metallic material layer 232, and an insulating barrier layer 134 located between the metallic material layer and the metamagnetic material layer.

According to an embodiment of the present disclosure, the metamagnetic material layer 136 may directly contact the ferroelectric material layer 280 and the insulating barrier layer 134.

According to an embodiment of the present disclosure, the metamagnetic tunnel junction 240 has different tunneling magnetoresistance between a first state in which the metamagnetic material layer 236 is in the non-magnetic state and a second state in which the metamagnetic material layer 236 is in the magnetic state. The mechanism for the different tunneling magnetoresistance between the first state and the second state can be caused by constriction of tunneling current by available electronic surface states at the interface between the metamagnetic material layer 236 and the insulating barrier layer 134. In one embodiment, the metamagnetic material of the metamagnetic material layer 236 can have a variable surface density of states at an interface with the insulating barrier layer 134 that changes between the non-magnetic state of the metamagnetic material and the magnetic state of the metamagnetic material. In one embodiment, the metamagnetic tunnel junction 240 has a variable tunneling resistance that increases with a decrease in the variable surface density of states of the metamagnetic material of the metamagnetic material layer 236 at the interface with the insulating barrier layer 134.

In one embodiment, the magnetic state of the metamagnetic material layer 236 comprises a ferromagnetic state, a ferrimagnetic state, or an antiferromagnetic state, and the non-magnetic state of the metamagnetic material layer 236 comprises a paramagnetic state of a diamagnetic state. In one embodiment, the metamagnetic material layer 236 has a first surface density of states in the magnetic state, and the metamagnetic material layer 236 has a second surface layer density in the non-magnetic state. The ratio of the first surface density of states to the second surface state density can be at a level that can be detected by a sensing circuit connected to the magnetoresistive memory cell 180. For example, the ratio of the first surface density of states to the second surface density of states may be in a range from 0.1 to 0.95, such as from 0.2 to 0.75, or may be in a range from 1.05 to 10, such as from 1.33 to 5. The ratio of the first surface density of states to the second surface density of states depends on the nature of the changes in the surface electronic states at the interface between the metamagnetic material layer 236 and the insulating barrier layer 134.

In one embodiment, the ferroelectric material layer 280 comprises two bistable polarization directions for the non-zero electric polarization. Alignment of the non-zero electric polarization along one of the two bistable polarization directions induces the magnetic state in the metamagnetic material layer 236, and alignment of the non-zero electric polarization along another of the two bistable polarization directions induces the non-magnetic state in the metamagnetic material layer 236. In one embodiment, the two bistable polarization directions of the non-zero electric polarization of the ferroelectric material layer 280 can be opposite directions, i.e., can be antiparallel to each other. In one embodiment, the two bistable polarization directions can be at a non-zero angle with respective to the interface between the ferroelectric material layer 280 and the metamagnetic material layer 236. In one embodiment, the two bistable polarization directions can be at an angle in a range from 30 degrees to 90 degrees, such as from 60 degrees to 90 degrees, with respective to the interface between the ferroelectric material layer 280 and the metamagnetic material layer 236.

In one embodiment, the first exemplary magnetoresistive memory device can include a programming circuitry comprises a row decoder 560 and a programming and sensing circuit 570 that are configured to apply a first programming voltage pulse of a first polarity between the first electrode 170 and the second electrode 270 to program the metamagnetic material layer 236 into the magnetic state, and to apply a second programming pulse of a second polarity that is the opposite of the first polarity between the first electrode 170 and the second electrode 270 to program the metamagnetic material layer 236 into the non-magnetic state. Specifically, the programming voltage pulses may change the polarization direction of the ferroelectric material layer 280. The polarization direction of the ferroelectric material layer 280 then causes the metamagnetic material layer 236 to change between the magnetic state and the non-magnetic state or vice-versa. In one embodiment, the first polarity can provide a more positive voltage to the first electrode 170 relative to the second electrode 270 and the second polarity can provide a more negative voltage to the first electrode 170 relative to the second electrode 270. In another embodiment, the first polarity can provide a more negative voltage to the first electrode 170 relative to the second electrode 270 and the second polarity can provide a more positive voltage to the first electrode 170 relative to the second electrode 270.

Thus, an applied voltage may be used to change the state of the metamagnetic material layer 236 without generating a tunneling current through the junction 240. This reduces the amount of power required to change the resistivity of the memory cell 180. The correspondence between the specific polarization direction of the ferroelectric material layer 280 and the magnetic or non-magnetic state of the metamagnetic material layer 236 depends on particular materials of layers 280 and 236.

In an illustrative example, the ferroelectric material layer 280 includes $HfO_2$ or $BaTiO_3$ and has a thickness in a range from 1 nm to 5 nm, the metamagnetic material layer 236 includes a cobalt layer or an FeRh layer having a thickness in a range from 1 nm to 3 nm, the insulating barrier layer 134 includes a magnesium oxide layer having a thickness in a range from 1 nm to 3 nm, and the metallic material layer 232 includes a TiN layer or a tungsten layer having a thickness in a range from 2 nm to 5 nm. In this case, the first programming pulse may have a magnitude in a range from 0.5 V to 3.0 V, and the second programming pulse may have a magnitude in a range from –0.5 V to –3.0 V. The duration of each of the first programming pulse and the second programming pulse may be in a range from 0.1 ns to 100 ns, such as from 1 ns to 10 ns, although lesser and greater pulse durations can also be employed. The programming and sensing circuit 570 can be configured to apply a sensing pulse having a magnitude in a range from 0.1 V to 0.5 V.

In one embodiment, a magnetoresistive random access memory is provided, which includes a two-dimensional array of instances of the first exemplary magnetoresistive memory cell 180, word lines 30 electrically connecting a respective subset of the first electrodes 170 of the two-dimensional array, bit lines 90 electrically connecting a respective subset of the second electrodes 270 of the two-dimensional array, a row decoder 560 and a programming and sensing circuit 570 connected to the word lines 30, and the bit lines 90 and configured to program one or more of the first exemplary magnetoresistive memory cells 180.

In one embodiment, the first exemplary magnetoresistive memory device of FIG. 2 can be programmed by applying a first polarity programming voltage to the first electrode 170 relative to the second electrode 270 in a first programming step to switch a state of the metamagnetic material layer 236 from the non-magnetic state to the magnetic state, and/or by applying a second polarity programming voltage having an opposite polarity of the first polarity programming voltage the first electrode 170 relative to the second electrode 270 in a second programming step to switch the state of the metamagnetic material layer 236 from the magnetic state to the non-magnetic state.

In one embodiment, the first polarity programming voltage changes a polarization direction of the ferroelectric material layer from a first direction to a second direction, which causes the metamagnetic material layer state to change from the non-magnetic state to the magnetic state. The second polarity programming voltage changes the polarization direction of the ferroelectric material layer from the second direction to the first direction, which causes the metamagnetic material layer state to change from the magnetic state to the non-magnetic state. In one embodiment, the state of the metamagnetic material layer 236 can be sensed by measuring tunneling magnetoresistance of the metamagnetic tunnel junction 240. The tunneling magnetoresistance can change between 40 and 150 percent between the two states of the metamagnetic material layer 236.

Figure 3A:
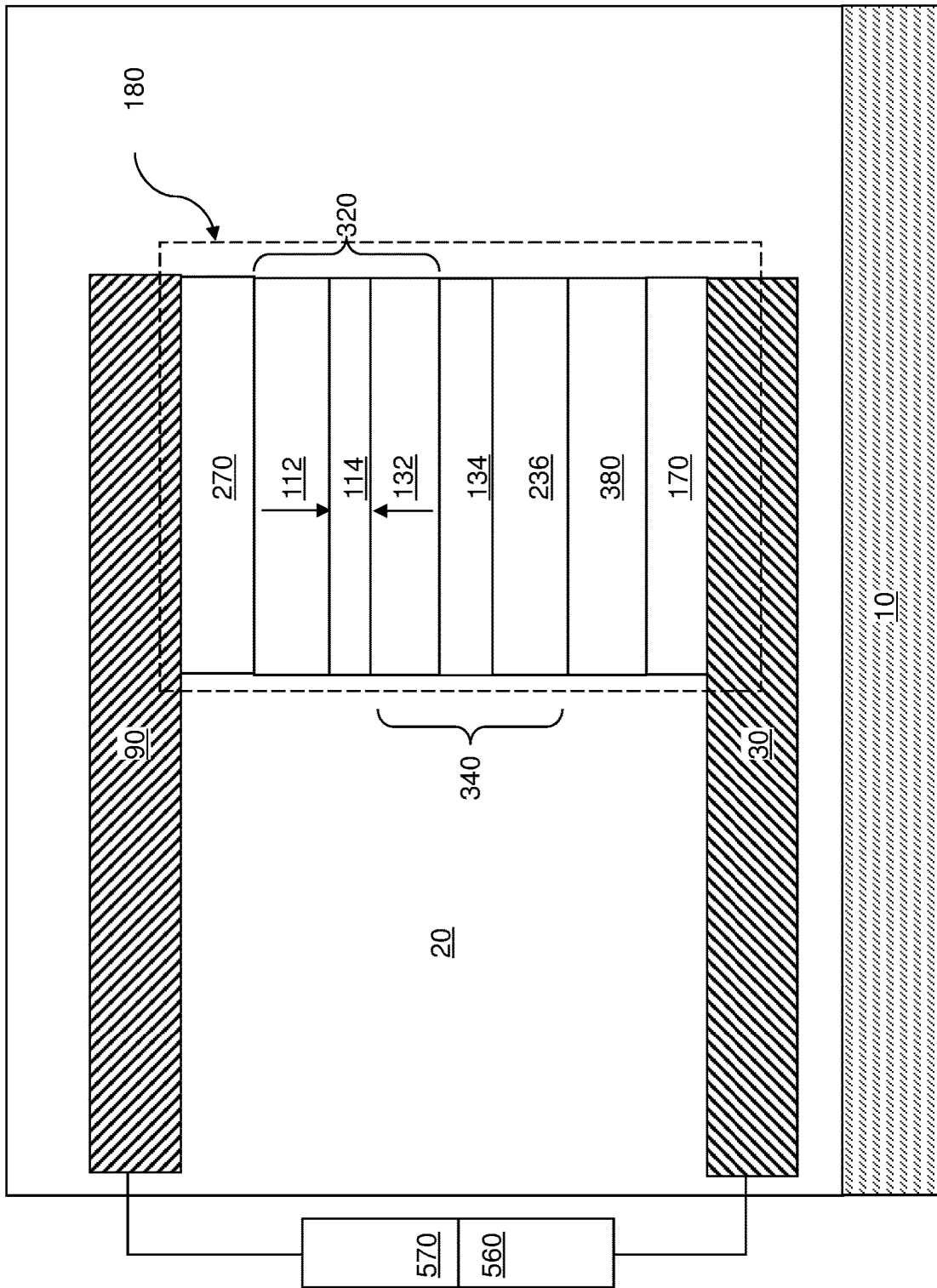
FIG. 3A schematically illustrates a first configuration of a second exemplary tunneling metamagnetic resistance (TMMR) memory cell according to a second embodiment of the present disclosure.
Figure 3B:
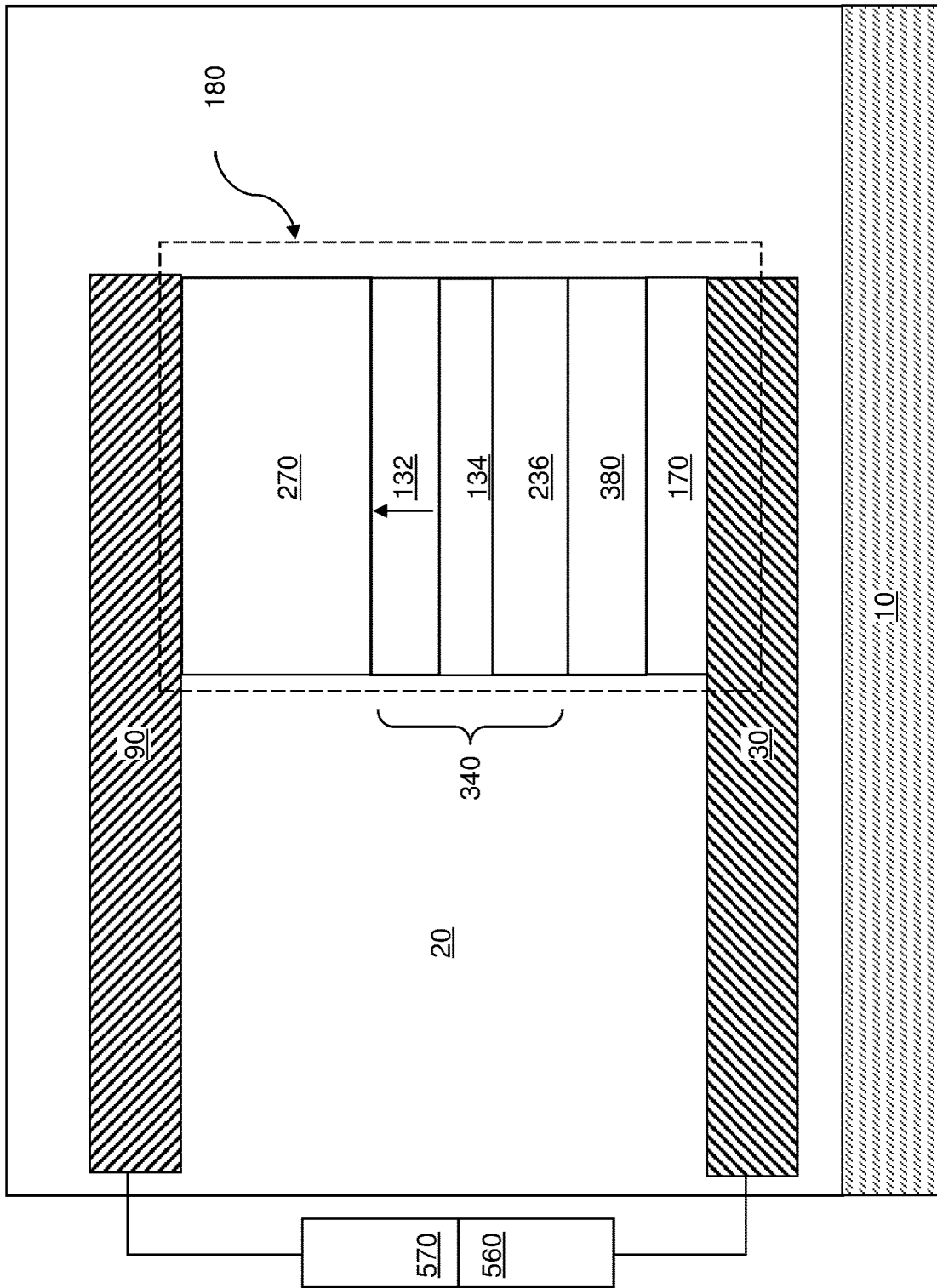
FIG. 3B schematically illustrates a second configuration of the second exemplary tunneling metamagnetic resistance (TMMR) memory cell according to the second embodiment of the present disclosure.

Referring to FIGS. 3A and 3B, second exemplary tunneling metamagnetic resistance (TMMR) memory cells 180 according to the second embodiment of the present disclosure are illustrated. FIG. 3A illustrates a first configuration of the second exemplary structure, and FIG. 3B illustrates a second configuration of the second exemplary structure which both include a multiferroic material layer 380 in place of the ferroelectric material layer 280. The second exemplary magnetoresistive memory device can include a magnetoresistive memory cell 180 that can function as a unit memory cell of the magnetoresistive random access memory device 500. In this case, a plurality of magnetoresistive memory cells 180 can be formed in an array configuration, which may be a two-dimensional array configuration or a three-dimensional array configuration. Alternatively, the magnetoresistive memory cells 180 illustrated in FIGS. 3A and 3B may be formed as a discrete memory device that is connected to a respective programming and sensing circuit. In other words, each magnetoresistive memory cell 180 may be connected to a respective programming and sensing circuit.

Each magnetoresistive memory cell 180 can include a first electrode 170, a second electrode 270, and a layer stack (380, 340) located between the first electrode 170 and the second electrode 270. The first and second electrodes (170, 270) and the word lines and bit lines (30, 90) may be the same as in the first embodiment and will not be described in more detail below.

The layer stack (380, 340) includes a multiferroic material layer 380 including a multiferroic material, and includes a metamagnetic tunnel junction 340. As used herein, a "multiferroic" material refers to a material that exhibits at least two of a ferromagnetic-type order (such as ferromagnetism, antiferromagnetism, or ferrimagnetism), ferroelectricity, and ferroelasticity. As used herein, a "magnetoelectric multiferroic" refers to a material that exhibits the ferromagnetic-type order and ferroelectricity. A change in total magnetization is coupled to a change in total electric polarization in a magnetoelectric multiferroic, and thus, a magnetic transition can be coupled to a change in the electric polarization and vice versa.

The metamagnetic tunnel junction 340 is shown in FIGS. 3A and 3B as being located on the multiferroic material layer 380 (i.e., between the multiferroic material layer 380 and the second electrode 270). However, in an alternative embodiment, the metamagnetic tunnel junction 340 may be located under the multiferroic material layer 380 (i.e., between the multiferroic material layer 280 and the first electrode 170). The metamagnetic tunnel junction 340 can contact a surface of the multiferroic material layer 380.

The metamagnetic tunnel junction 340 comprises a metamagnetic material layer 236 located in contact with the multiferroic material layer 380 and comprising a material having a non-magnetic state and a magnetic state, an insulating barrier layer 134 located on the metamagnetic material layer 236, and a reference magnetization layer 132 located on the insulating barrier layer 134 and having a fixed magnetization direction. The metamagnetic tunnel junction 340 can contact a surface of the multiferroic material layer 380.

In one embodiment, the multiferroic material layer 380 can include, and/or can consist essentially of, a magnetoelectric multiferroic material that exhibits a ferromagnetic-type order and ferroelectricity. Thus, the multiferroic material layer 380 has a non-zero electric polarization. A change in total magnetization is coupled to a change in total electric polarization in a magnetoelectric multiferroic, and thus, a magnetic transition can be coupled to a change in the electric polarization and vice versa.

In one embodiment, the multiferroic material layer 380 comprises, and/or consists essentially of, a multiferroic material in which the relative orientation between the non-zero electric polarization of the multiferroic material layer 380 and the net magnetization of the multiferroic material layer 380 is invariant upon reversal of a direction of the non-zero electric polarization of the multiferroic material layer 380. In one embodiment, the magnetization of the multiferroic material layer 380 has a bistable configuration in which a first magnetization direction and a second magnetization direction are stable directions for the magnetization of the multiferroic material layer, and the second magnetization direction is antiparallel to the first magnetization direction.

In an illustrative example, the relative orientation between the non-zero electric polarization of $BiFeO_3$ multiferroic material and the net magnetization of $BiFeO_3$ is invariant upon reversal of a direction of the non-zero electric polarization of $BiFeO_3$, In one embodiment, the multiferroic material layer 380 may comprise a material selected from $BiFeO_3$, h-$YMnO_3$, $BaNiF_4$, $PbVO_3$, $BiMnO_3$, $LuFe_2O_4$, $HoMn_2O_5$, h-$HoMnO_3$, h-$ScMnO_3$, h-$ErMnO_3$, h-$TmMnO_3$, h-$YbMnO_3$, h-$LuMnO_3$, $K_2SeO_4$, $Cs_2CdI_4$, $TbMnO_3$, $Ni_3V_2O_8$, $MnWO_4$, $CuO$, $ZnCr_2Se_4$, $LiCu_2O_2$, and $Ni_3B_7O_{13}I$. The thickness of the multiferroic material layer 380 can be in a range from 1 nm to 10 nm, such as from 2 nm to 5 nm, although lesser and greater thicknesses can also be employed.

The metamagnetic tunnel junction 340 can include a metamagnetic material layer 236 located in contact with (e.g., located on) the multiferroic material layer 380. In one embodiment, the magnetic state of the metamagnetic material of the metamagnetic tunnel junction 340 may be a ferromagnetic state having a non-zero net magnetization. The non-magnetic state may be a paramagnetic state or a diamagnetic state. In one embodiment, the metamagnetic material layer 236 can comprise, and/or can consist essentially of, a material selected from Co, a FeRh alloy, an EuSe alloy, $CrO_2$, and/or LSM.

The insulating barrier layer 134 includes an insulating barrier material for forming a metamagnetic tunnel junction. The insulating barrier layer 134 can include, for example, magnesium oxide, aluminum oxide, strontium titanate, or a combination thereof. The thickness of the insulating barrier layer 134 can be in a range from 0.5 nm to 2.0 nm, such as from 0.7 nm to 1.2 nm, although lesser and greater thicknesses can also be employed.

The reference magnetization layer 132 can include a ferromagnetic material having perpendicular magnetic anisotropy. The reference magnetization layer 132 includes a material that can provide high perpendicular magnetic anisotropy. Thus, the magnetization direction of the reference magnetization layer 132 is along a vertical direction, i.e., the direction that is perpendicular to the interfaces between contacting layers within metamagnetic tunnel junction 340. The ferromagnetic material of the reference magnetization layer 132 does not need to generate any spin-polarized current.

In one embodiment, the reference magnetization layer 132 comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack. In an illustrative example, the reference magnetization layer 132 can include $L1_0$ alloys of FePt, FePd, or CoPt disclosed in Journal of Applied Physics 111, 07A708 (2012). The FePt alloy, the FePd alloy, and the CoPt alloy can have a magnetic anisotropy constant of $6.6\times10^7$ erg/cm$^3$, $1.8\times10^7$ erg/cm$^3$, and $4.9\times10^7$ erg/cm$^3$, respectively. In another illustrative example, the reference magnetization layer 132 can include Pt/Co multilayers, Co/Ag multilayers, Co/Cu multilayers, or Co/Ni multilayers, or can include (Pt/Co/Pt)/Pd multilayers, (Pt/Co/Pt)/Ag multilayers, (Pt/Co/Pt)/Cu multilayers, or (Pt/Co/Pt)/Ni multilayers disclosed in IEEE Transaction on Magnetics 31, 3337 (1995). In yet another illustrative example, the reference magnetization layer 132 can include Co/(Pt/Pd) multilayers or Co/(Pd/Pt) multilayers disclosed in Journal of Applied Physics 77, 3995 (1995). Alternatively, the reference magnetization layer 132 can include a Fe layer, a Co layer, a Ni layer, a CoFeB layer, a CoFe layer, a Co/Ni multilayer structure or a Co/Pt multilayer structure. The reference magnetization layer 132 can have a thickness of 2 to nm, such as 3 to 6 nm.

In the first configuration of the second exemplary structure, a synthetic antiferromagnet (SAF) structure 320 may be provided. In this case, the SAF structure 320 comprises a layer stack including, from one side to another, the reference magnetization layer 132, an antiferromagnetic coupling layer 114, and a fixed magnetization layer 112.

The reference magnetization layer 132 can include any soft ferromagnetic material, such as CoFe or CoFeB. The antiferromagnetic coupling layer 114 can include an anti-ferromagnetic coupling material, such as ruthenium, iridium, iridium-manganese alloy or a multilayer stack of cobalt and platinum layers, and can have a thickness in a range from 0.5 nm to 2 nm. The thickness of the antiferromagnetic coupling layer 114 can be optimized to maximize antiferromagnetic coupling between the reference magnetization layer 132 and the fixed magnetization layer 112.

The fixed magnetization layer 112 is spaced from the reference magnetization layer 132, and can include any material that may be employed for the reference magnetization layer 132. The thickness of the fixed magnetization layer 112 can be in a range from 2 to 10 nm, such as 3 to 6 nm. The antiferromagnetic coupling layer 114 antiferromagnetically couples the fixed magnetization of reference magnetization layer 132 to the magnetization of the fixed magnetization layer 112. Thus, the fixed magnetization of reference magnetization layer 132 is antiparallel to the magnetization of the fixed magnetization layer 112.

In the second configuration of the second exemplary structure shown in FIG. 3B, any hard magnetic material that can provide high perpendicular magnetic anisotropy can be employed for the reference magnetization layer 132. In this embodiment, the SAF structure 320 is omitted.

In one embodiment, the second electrode 270 may comprise capping layer located on the metallic material layer 232. In this case, the second electrode 270 can comprise, and/or can consist essentially of, Ru and/or Ta. Alternatively, the second electrode 270 may comprise at least one non-magnetic transition metal, which may be selected from Cu, Cr, Ti, Ta, W, Mo, Al, Au and/or Ru.

In the first configuration illustrated in FIG. 3A, the second electrode 270 can contact the fixed magnetization layer 112 of the SAF structure 320. In the second configuration illustrated in FIG. 3B, the second electrode 270 can contact the reference magnetization layer 132.

In an alternative embodiment, the first electrode 170 may comprise a portion of a word line 30 that has an areal overlap with the area of the metamagnetic tunnel junction 340 and directly contacts a surface of the multiferroic material layer 380. Additionally or alternatively, the second electrode 270 may comprise portion of a bit line 90 that has an areal overlap with the area of the metamagnetic tunnel junction 340 and directly contacts a surface of the metallic material layer 232.

According to an embodiment of the present disclosure, the multiferroic material layer 380 has a non-zero electric polarization that is coupled to the magnetization of the multiferroic material layer 380. A programming voltage pulse applied between the first and the second electrodes (170, 270) changes the electric polarization direction of the multiferroic material layer 380, which causes a corresponding change in the magnetization direction of the multiferroic material layer 380. In one embodiment, the multiferroic material layer 380 is magnetically coupled to the metamagnetic material layer 236, and a change in the magnetization direction in the multiferroic material layer 380 induces a transition between the magnetic state and the non-magnetic state of the metamagnetic material layer 236. Thus, the resistivity state of the metamagnetic tunnel junction 340 may be changed by an applied programming voltage pulse alone without generating a tunneling current through the junction 340.

In summary, the ferroelectric nature of the multiferroic material will induce ferromagnetism in metamagnetic material. Furthermore, the magnetic nature of the multiferroic materials will align the ferromagnetic spins of the magnetic state of metamagnetic material in one of two directions. Thus, the magnetization direction of the multiferroic material layer 380 is coupled to the direction of the non-zero electric polarization of the multiferroic material layer 380. A change in the direction of the non-zero electric polarization of the multiferroic material layer 380 induces a change in the magnetization direction in the multiferroic material layer 380. The direction of the non-zero electric polarization of the multiferroic material layer 380 may be changed by an external voltage applied between the first electrode 170 and the second electrode 270, which generates an electric field along the vertical direction either upward or downward depending on the polarity of the external voltage. Upon application of a sufficient voltage in either direction, the vertical component of the non-zero electric polarization of the multiferroic material layer 380 aligns to the vertical direction of the electrical field within the multiferroic material layer 380. One of the first magnetization direction and the second magnetization direction of the multiferroic material layer 380 induces the magnetic state within the metamagnetic material layer 236, and the other of the first magnetization direction and the second magnetization direction of the multiferroic material layer induces the non-magnetic state within the metamagnetic material layer 236. In one embodiment, the magnetic state comprises a ferromagnetic state having a magnetization direction which is aligned in one of the first or the second magnetization directions. The specific directions depend on the materials of layer 380 and 236.

A magnetoresistive memory device 180 of the second embodiment includes a first electrode 170, a second electrode 270, and a layer stack (340, 380) located between the first electrode and the second electrode, the layer stack comprising a multiferroic material layer 380 and a metamagnetic tunnel junction 340. The metamagnetic tunnel junction 340 comprises a metamagnetic material layer 236, a reference magnetization layer 132, and an insulating barrier layer 134 located between the reference magnetization layer and the metamagnetic material layer.

In one embodiment, the metamagnetic material layer 236 physically contacts the multiferroic material layer 280 and the insulating barrier layer 134.

In one embodiment, the magnetic state of the metamagnetic material layer 236 comprises a ferromagnetic state of the metamagnetic material layer 236. In one embodiment, the reference magnetization layer 132 comprises a fixed magnetization direction that is oriented along a direction that is antiparallel to the vertical component of a magnetization direction of the ferromagnetic state of the metamagnetic material layer 236.

Generally, a tunnel junction with two ferromagnetic material layers with antiferromagnetic alignment of magnetizations provides a higher tunneling resistance than a tunnel junction in which one of the two ferromagnetic material layers is replaced with a non-magnetic metallic material having the same electrical conductivity as the replaced ferromagnetic material layer. The metamagnetic tunnel junction 340 has a first state (which is a low resistance state) in which the metamagnetic material layer 236 is in a non-magnetic state. The metamagnetic tunnel junction 340 has a second state (which is a high resistance state) in which the metamagnetic material layer 236 is in a ferromagnetic state with a magnetization direction that is antiparallel to the magnetization direction of the reference magnetization layer 132.

The first state can provide a first tunneling magnetoresistance, and the second state can provide a second, higher tunneling magnetoresistance. In other words, the metamagnetic tunnel junction 340 can have the first tunneling magnetoresistance while the metamagnetic material layer 236 is in the non-magnetic state, and the metamagnetic tunnel junction 340 can have the second, higher tunneling magnetoresistance while the metamagnetic material layer 236 is in the magnetic state. In one embodiment, the second tunneling magnetoresistance is at least 105% of the first tunneling magnetoresistance. For example, the ratio of the second tunneling magnetoresistance to the first tunneling magnetoresistance may be in a range from 1.05 to 6, such as from 2 to 6.

The second exemplary magnetoresistive memory cells 180 is a tunneling metamagnetic resistance (TMMR) memory cell. The magnetic state of the metamagnetic material layer 236 in the second exemplary magnetoresistive memory cell 180 may comprise a ferromagnetic state provided that the magnetic state of the metamagnetic material layer 236 can provide a different tunneling magnetoresistance than the non-magnetic state of the metamagnetic material layer 236 in the second exemplary magnetoresistive memory cell 180. Generally, the non-magnetic state of the metamagnetic material layer 236 comprises a paramagnetic state or a diamagnetic state.

In one embodiment, the second exemplary magnetoresistive memory device can include a programming circuit including a row decoder 560 and a programming and sensing circuit 570 that that is configured to apply a first programming pulse of a first polarity between the first electrode 170 and the second electrode 270 to program the metamagnetic material layer 236 into the magnetic state, and to apply a second programming pulse of a second polarity that is the opposite of the first polarity across the first electrode 170 and the second electrode 270 to program the metamagnetic material layer 236 into the non-magnetic state. The transition between the magnetic state and the non-magnetic state of the metamagnetic material layer 236 can be induced through the change in the direction of the non-zero electric polarization within the multiferroic material layer 380 during application of the first programming pulse or the second programming pulse.

In one embodiment, the first polarity can provide a more positive voltage to the first electrode 170 relative to the second electrode 270 and the second polarity can provide a more negative voltage to the first electrode 170 relative to the second electrode 270. In another embodiment, the first polarity can provide a more negative voltage to the first electrode 170 relative to the second electrode 270 and the second polarity can provide a more positive voltage to the first electrode 170 relative to the second electrode 270.

In an illustrative example, the multiferroic material layer 380 includes $BaTiO_3$ and has a thickness in a range from 1 nm to 5 nm, the metamagnetic material layer 236 includes a cobalt layer or an FeRh layer having a thickness in a range from 1 nm to 3 nm, the insulating barrier layer 134 includes a magnesium oxide layer having a thickness in a range from 1 nm to 3 nm, and the reference magnetization layer 132 includes a CoFe layer or a CoFeB layer having a thickness in a range from 1 nm to 2 nm. In this case, the first programming pulse may have a magnitude in a range from 0.5 V to 3 V, and the second programming pulse may have a magnitude in a range from −0.5 V to −3 V. The duration of each of the first programming pulse and the second programming pulse may be in a range from 0.1 ns to 100 ns, such as from 1 ns to 10 ns, although lesser and greater pulse durations can also be employed. The programming and sensing circuit 570 can be configured to apply a sensing pulse having a magnitude in a range from 0.1 V to 0.5 V.

In one embodiment, a magnetoresistive random access memory is provided, which includes a two-dimensional array of second exemplary magnetoresistive memory cells 180, word lines 30 electrically connecting a respective subset of the first electrodes 170 of the two-dimensional array, bit lines 90 electrically connecting a respective subset of the second electrodes 270 of the two-dimensional array, and a programming and sensing circuit 570 connected to the bit lines 90 and row decoders 560 connected to the word lines 30 and configured to program a respective set of the exemplary magnetoresistive memory cells 180.

In the second embodiment, the second exemplary magnetoresistive memory devices of FIGS. 3A and 3B can be programmed by applying a first polarity programming voltage to the first electrode 170 relative to the second electrode 270 in a first programming step to switch a state of the metamagnetic material layer 236 from the non-magnetic state to the magnetic state, and/or by applying a second polarity programming voltage having an opposite polarity of the first polarity programming voltage the first electrode 170 relative to the second electrode 270 in a second programming step to switch the state of the metamagnetic material layer 236 from the magnetic state to the non-magnetic state. In one embodiment, the state of the metamagnetic material layer 236 can be sensed by measuring tunneling magnetoresistance of the metamagnetic tunnel junction 240.

The various embodiments of the present disclosure provide a magnetoresistive memory device containing a metamagnetic material layer 236, which is located a metamagnetic tunneling junction that provides a tunneling metamagnetic resistance (TMMR) that changes with a change in the magnetic state of the metamagnetic material layer 236. The underlying mechanism for the change in the TMMR may be a change in the surface density of states at the interface between the metamagnetic material layer 236 and the insulating barrier layer 134 that accompanies a magnetic phase transition within the metamagnetic material layer 236 as in the case of the first exemplary TMMR memory device of FIG. 2 of the first embodiment. Alternatively, the underlying mechanism for the change in the TMMR may be a change in the tunneling efficiency of electrons between the non-magnetic state of the metamagnetic material layer 236 in which the spin of the electrons does not play a role, and the magnetic state of the metamagnetic material layer 236 in which the antiparallel alignment of magnetizations of the metamagnetic material layer 236 and the reference magnetization layer 132 decreases tunneling efficiency of electrons as in the case of the second exemplary TMMR memory device of FIGS. 3A and 3B of the second embodiment. In both embodiments, only an applied voltage may be used to switch the resistance state of the memory cell without using a tunneling current through the junction (240, 340). Thus, a lower switching energy may be used to deterministically program the TMMR MRAM memory cell with a relatively high TMR (e.g., 500% to 600%). In contrast, prior art STT MRAMs require higher switching energy and tunneling current for programming, while prior art VCMA MRAMs use an applied voltage to program the memory cells non-deterministically.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetoresistive memory device, comprising:
a first electrode;
a second electrode; and
a layer stack located between the first electrode and the second electrode, the layer stack comprising a ferroelectric material layer and a metamagnetic tunnel junction, wherein the metamagnetic tunnel junction comprises:
a metamagnetic material layer;
a metallic material layer;
an insulating barrier layer between the metallic material layer and the metamagnetic material layer; and
at least one feature comprising:
(a) a first feature wherein the metamagnetic material layer contacts the ferroelectric material layer and the insulating barrier layer and wherein the metamagnetic tunnel junction has different tunneling magnetoresistance between a first state in which the metamagnetic material layer is in the non-magnetic state and a second state in which the metamagnetic material layer is in the magnetic state; or
(b) a second feature wherein:
the ferroelectric material layer comprises two bistable polarization directions;
alignment of the non-zero electric polarization along one of the two bistable polarization directions induces the magnetic state in the metamagnetic material layer; and
alignment of the non-zero electric polarization along another of the two bistable polarization directions induces the non-magnetic state in the metamagnetic material layer;
or
(c) a third feature wherein the metallic material layer comprises a non-magnetic metallic material; or
(d) a fourth feature wherein the ferroelectric material layer comprises a material selected from hafnium oxide, zirconium oxide, hafnium-zirconium oxide, bismuth ferrite, barium titanate, colemanite, bismuth titanate, europium barium titanate, ferroelectric polymer, germanium telluride, langbeinite, lead scandium tantalate, lead titanate, lead zirconate titanate, lithium niobite, lanthanum aluminum oxide, polyvinylidene fluoride, potassium niobate, potassium sodium tartrate, potassium titanyl phosphate, sodium bismuth titanate, lithium tantalate, lead lanthanum titanate, lead lanthanum zirconate titanate, ammonium dihydrogen phosphate, or potassium dihydrogen phosphate; or
(e) a fifth feature wherein the metamagnetic material layer comprises a material selected from Co, a FeRh alloy, an EuSe alloy, $CrO_2$, or $LaSrMnO_3$; or
(f) a sixth feature wherein the insulating barrier layer comprises a material selected from magnesium oxide, aluminum oxide, strontium titanate or a combination thereof; or
(g) a seventh feature comprising a programming circuit that is configured:
to apply a first programming pulse of a first polarity between the first electrode and the second electrode to program the metamagnetic material layer into the magnetic state; and
to apply a second programming pulse of a second polarity that is an opposite of the first polarity between the first electrode and the second electrode to program the metamagnetic material layer into the non-magnetic state.

2. The magnetoresistive memory device of claim 1, wherein the at least one feature comprises the first feature.

3. The magnetoresistive memory device of claim 2, wherein the metamagnetic material has a variable surface density of states at an interface with the insulating barrier layer that changes between the non-magnetic state of the metamagnetic material and the magnetic state of the metamagnetic material.

4. The magnetoresistive memory device of claim 3, wherein:
the magnetic state of the metamagnetic material layer comprises a ferromagnetic state, a ferrimagnetic state, or an antiferromagnetic state; and
the non-magnetic state of the metamagnetic material layer comprises a paramagnetic state of a diamagnetic state.

5. The magnetoresistive memory device of claim 3, wherein the metamagnetic tunnel junction has a variable tunneling resistance that increases with a decrease in the variable surface density of states of the metamagnetic material at the interface with the insulating barrier layer.

6. The magnetoresistive memory device of claim 3, wherein:
the metamagnetic material layer has a first surface density of states in the magnetic state; and
the metamagnetic material layer has a second surface density of states in the non-magnetic state which is different from the first surface density of states.

7. The magnetoresistive memory device of claim 1, wherein the at least one feature comprise the second feature.

8. The magnetoresistive memory device of claim 7, wherein the two bistable polarization directions are at a non-zero angle with respective to an interface between the ferroelectric material layer and the metamagnetic material layer.

9. The magnetoresistive memory device of claim 1, wherein the at least one feature comprise the third feature.

10. The magnetoresistive memory device of claim 1, wherein the metallic material comprises Cu, Cr, Ti, Ta, Au or Ru.

11. The magnetoresistive memory device of claim 10, wherein the second electrode comprises a Ru or Ta capping layer located on the metallic material layer.

12. The magnetoresistive memory device of claim 1, wherein the at least one feature comprise the fourth feature.

13. The magnetoresistive memory device of claim 1, wherein the at least one feature comprise the fifth feature.

14. The magnetoresistive memory device of claim 1, wherein the at least one feature comprise the sixth feature.

15. The magnetoresistive memory device of claim 1, wherein the at least one feature comprise the seventh feature.

16. A magnetoresistive random access memory device, comprising:

a two-dimensional array of instances of a magnetoresistive memory device comprising:
a first electrode;
a second electrode; and
a layer stack located between the first electrode and the second electrode, the layer stack comprising a ferroelectric material layer and a metamagnetic tunnel junction, wherein the metamagnetic tunnel junction comprises:
a metamagnetic material layer;
a metallic material layer; and
an insulating barrier layer between the metallic material layer and the metamagnetic material layer; and
word lines electrically connected to a respective subset of the first electrodes of the two-dimensional array;
bit lines electrically connected to a respective subset of the second electrodes of the two-dimensional array; and
a programming circuit connected to the bit lines and the word lines and configured to program the magnetoresistive memory device.

17. A method of operating a magnetoresistive memory device comprising:
a first electrode;
a second electrode; and
a layer stack located between the first electrode and the second electrode, the layer stack comprising a ferroelectric material layer and a metamagnetic tunnel junction, wherein the metamagnetic tunnel junction comprises:
a metamagnetic material layer;
a metallic material layer; and
an insulating barrier layer between the metallic material layer and the metamagnetic material layer;
the method comprising:
applying a first polarity programming voltage to the first electrode relative to the second electrode in a first programming step to switch a state of the metamagnetic material layer from the non-magnetic state to the magnetic state; and
applying a second polarity programming voltage having an opposite polarity of the first polarity programming voltage to the first electrode relative to the second electrode in a second programming step to switch the state of the metamagnetic material layer from the magnetic state to the non-magnetic state.

18. The method of claim 17, wherein:
the first polarity programming voltage changes a polarization direction of the ferroelectric material layer from a first direction to a second direction, which causes the metamagnetic material layer state to change from the non-magnetic state to the magnetic state; and
the second polarity programming voltage changes the polarization direction of the ferroelectric material layer from the second direction to the first direction, which causes the metamagnetic material layer state to change from the magnetic state to the non-magnetic state.

19. The method of claim 18, further comprising determining the state of the metamagnetic material layer by measuring tunneling magnetoresistance of the metamagnetic tunnel junction.

* * * * *